US011856749B2

(12) United States Patent
Li

(10) Patent No.: US 11,856,749 B2
(45) Date of Patent: Dec. 26, 2023

(54) MEMORY AND METHOD FOR FORMING MEMORY

(71) Applicant: CHANGXIN MEMORY TECHNOLOGIES, INC., Hefei (CN)

(72) Inventor: Ran Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 79 days.

(21) Appl. No.: 17/455,518

(22) Filed: Nov. 18, 2021

(65) Prior Publication Data

US 2022/0077159 A1 Mar. 10, 2022

Related U.S. Application Data

(63) Continuation of application No. PCT/CN2021/091113, filed on Apr. 29, 2021.

(30) Foreign Application Priority Data

May 22, 2020 (CN) .......................... 202010440404.8

(51) Int. Cl.
*H10B 12/00* (2023.01)

(52) U.S. Cl.
CPC ....... *H10B 12/0335* (2023.02); *H10B 12/315* (2023.02); *H10B 12/482* (2023.02)

(58) Field of Classification Search
CPC .......................... H10B 12/0035; H10B 12/482
See application file for complete search history.

(56) References Cited

U.S. PATENT DOCUMENTS

| 2012/0205810 A1 | 8/2012 | Kim |
| 2015/0115392 A1* | 4/2015 | Yoon ...................... H10B 12/09 |
| | | 257/499 |

FOREIGN PATENT DOCUMENTS

| CN | 102751235 A | 10/2012 |
| CN | 109003938 A | 12/2018 |
| CN | 109037155 A | 12/2018 |
| CN | 209029380 U | 6/2019 |

(Continued)

OTHER PUBLICATIONS

Written Opinion as cited in PCT/CN2021/091113, dated Jul. 26, 2021, 6 pages.

(Continued)

*Primary Examiner* — Robert G Bachner
*Assistant Examiner* — Molly K Reida
(74) *Attorney, Agent, or Firm* — Cooper Legal Group, LLC

(57) ABSTRACT

Embodiments of the present application provide a memory and a method for forming the memory. The method includes: providing a substrate, and forming a bit line structure on the substrate and a first protective layer; forming a dielectric layer with which a gap between the adjacent bit line structures is filled; forming a second protective layer to cover a top surface of the first protective layer and a top surface of the dielectric layer; removing part of the dielectric layer and part of the second protective layer to form a capacitor contact hole, and exposing the first protective layer between two adjacent ones of the capacitor contact holes; forming a conductive layer with which the capacitor contact hole is filled and the top surface of the exposed first protective layer is covered, and etching part of the conductive layer to form a separate capacitor contact structure.

15 Claims, 10 Drawing Sheets

(56) References Cited

FOREIGN PATENT DOCUMENTS

CN    110970436 A    4/2020
KR    20080088098 A   10/2008

OTHER PUBLICATIONS

International Search Report as cited in PCT Application No. PCT/CN2021/091113 dated Jul. 27, 2021, 5 pages.

* cited by examiner

MEMORY AND METHOD FOR FORMING MEMORY

CROSS-REFERENCE TO RELATED APPLICATIONS

This application is a continuation application of International Patent Application No. PCT/CN2021/091113, filed on Apr. 29, 2021, which claims priority to Chinese Patent Application No. 202010440404.8, filed with the Chinese Patent Office on May 22, 2020 and entitled "MEMORY AND METHOD FOR FORMING MEMORY." International Patent Application No. PCT/CN2021/091113 and Chinese Patent Application No. 202010440404.8 are incorporated herein by reference in their entireties.

TECHNICAL FIELD

The present application relates to the field of semiconductors, and in particular to a memory and a method for forming the memory.

BACKGROUND

A manufacturing method of a Dynamic Random Access Memory (DRAM) mainly involves manufacture of a Storage Node Contact in a storage array area, a connecting layer between a capacitor and a landing pad, and an isolating structure between capacitor contact structures.

With the continuous development of semiconductor integrated circuit device technologies, how to effectively improve the production efficiency of memories and reduce the production and operation costs of the memories by optimizing the process flow has become vital. With the integration of memory process technologies reaching 20 nm or less, the integration level of semiconductor process technologies increases, and it is more and more difficult to reduce element sizes.

Especially in the process technology of an array area of a memory, the technological process of each device needs to solve a series of difficult process problems and some problems that can be avoided when the technological processes are connected, which are urgent problems to be solved at present.

SUMMARY

Embodiments of the present application provide a memory and a method for forming the memory, in which a current manufacturing process of the memory is simplified, further, the production efficiency of the memory is improved and the production and operation costs of the memory are reduced.

To solve the above-mentioned technical problems, an embodiment of the present application provides a method for forming a memory, including: providing a substrate, and forming a bit line structure on the substrate and a first protective layer on a top surface of the bit line structure; forming a dielectric layer with which a gap between the adjacent bit line structures is filled, wherein a top surface of the dielectric layer is flush with a top surface of the first protective layer; forming a second protective layer to cover the top surface of the first protective layer and the top surface of the dielectric layer; removing part of the dielectric layer and part of the second protective layer in a direction perpendicular to an extension direction of the bit line structure to form a capacitor contact hole, and exposing the first protective layer between two adjacent ones of the capacitor contact holes in the direction which is perpendicular to the extension direction of the bit line structure; forming a conductive layer to fill the capacitor contact holes and cover the top surface of the first protective layer exposed, wherein a top surface of the conductive layer is flush with a top surface of the second protective layer; and etching part of the conductive layer to form a separate capacitor contact structure.

In this embodiment of the present application, by adjusting the manufacturing process flow of the memory, the first protective layer is formed at the top of a bit line multi-layer when the bit line multi-layer is formed, and in the follow-up manufacturing process, the second protective layer is formed at the top of the first protective layer. The high and low staggered protective layers are ingeniously formed at the top of the bit line structure, which not only helps to reduce loss of the bit line structure in an etching process, but also ingeniously forms a connecting layer between a capacitor and the capacitor contact structure by one-step etching using a top-layer structure formed by the high and low staggered protective layers. Therefore, the existing manufacturing process flow of the memory is simplified, further, the production efficiency of the memory is improved, and the production and operation costs of the memory are reduced.

An embodiment of the present application further provides a memory, including: a substrate and a bit line structure on the substrate; a first protective layer on a top surface of the bit line structure; a capacitor contact structure and an isolating structure that are located between the bit line structures, wherein the capacitor contact structure and the isolating structure are alternately arranged in an extension direction of the bit line structure; a second protective layer on top surfaces of the first protective layer and the isolating structure that are located between the adjacent bit line structures, wherein an extension direction of the second protective layer is different from the extension direction of the bit line structure; and bulges disposed at a top of the capacitor contact structure, extending at intervals in a preset direction and on the top surface of part of the first protective layer, wherein the preset direction and the extension direction of the bit line structure form an angle.

Compared with the related art, the embodiments of the present application have the advantages that since the top of the capacitor contact structure formed in the present application is partially on the top surface of the first protective layer, the original arrangement mode of the capacitor contact structure is changed, such that a connection between the capacitor and the capacitor contact structure that are formed subsequently becomes simple. Therefore, the existing manufacturing process flow of the memory is improved, the production efficiency of the memory is improved and the production and operation costs of the memory are reduced.

BRIEF DESCRIPTION OF DRAWINGS

FIGS. 15 to 17A are schematic diagrams of formation of a capacitor contact structure according to an embodiment of the present application.

DESCRIPTION OF EMBODIMENTS

Currently, a relatively complicated manufacturing process of a memory severely impacts the production efficiency of the memory, and as a result, the reduction of production and operation costs of the memory.

To solve the above-mentioned problems, an embodiment of the present application provides a method for forming a memory, including: providing a substrate, and forming a bit line structure on the substrate and a first protective layer on a top surface of the bit line structure; forming a dielectric layer with which a gap between the adjacent bit line structures is filled, wherein a top surface of the dielectric layer is flush with a top surface of the first protective layer; forming a second protective layer to cover the top surface of the first protective layer and the top surface of the dielectric layer; removing part of the dielectric layer and part of the second protective layer in a direction perpendicular to an extension direction of the bit line structure to form a capacitor contact hole, and exposing the first protective layer between two adjacent ones of the capacitor contact holes in the direction which is perpendicular to the extension direction of the bit line structure; forming a conductive layer to fill the capacitor contact holes and cover the top surface of the first protective layer exposed, wherein a top surface of the conductive layer is flush with a top surface of the second protective layer; and etching part of the conductive layer to form a separate capacitor contact structure.

To make objects, technical solutions and advantages of the embodiments of the present application clearer, the embodiments of the present application will be described in detail below with reference to the accompanying drawings. However, it will be apparent to those of ordinary skill in the art that, in the various embodiments of the present application, a number of technical details are presented in order to provide readers with a better understanding of the present application. However, the technical solutions recited in the present application can still be implemented without these technical details and various changes and modifications based on the following embodiments. Division of the following embodiments is for ease of description, and should not constitute any limitation to the specific embodiments of the present application, and the various embodiments can be combined and referenced with each other on the premise of no contradiction.

Figure 1:
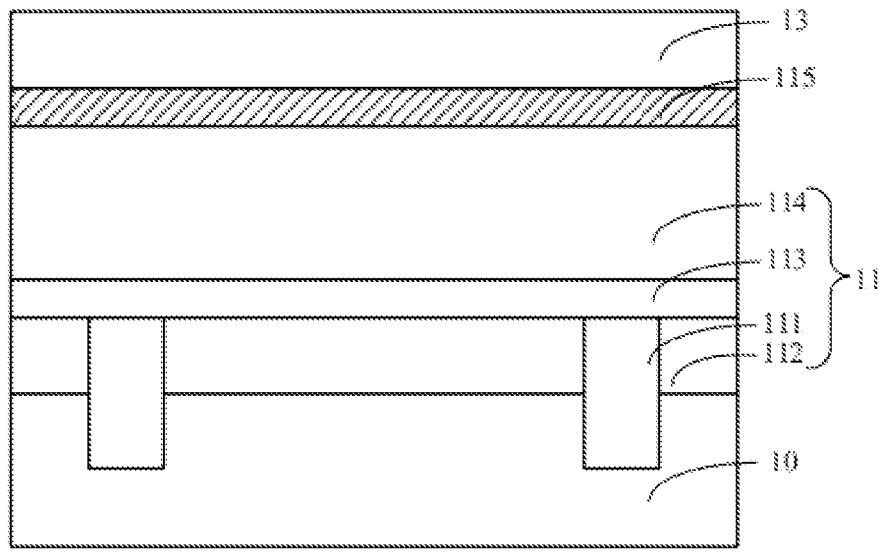
FIGS. 1 and 2 are schematic diagrams of formation of a bit line structure and a first protective layer according to an embodiment of the present application.
Figure 2:
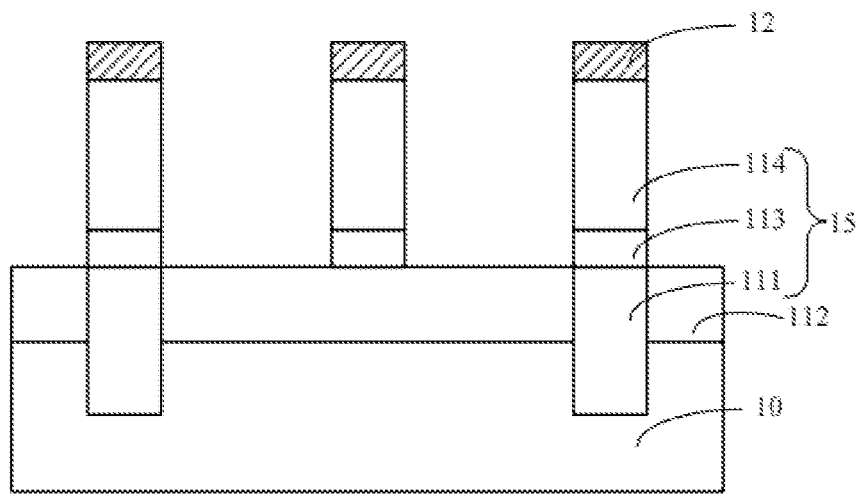
Figure 3:
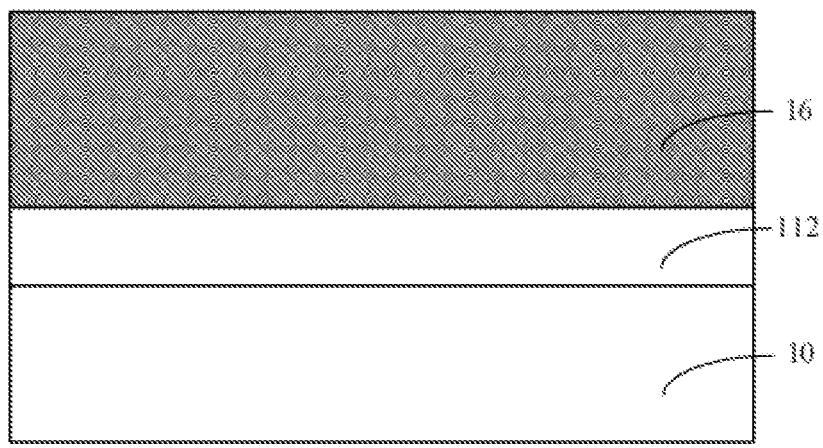
FIGS. 3 to 5 are schematic diagrams of formation of a dielectric layer and a second protective layer according to an embodiment of the present application.
Figure 4:
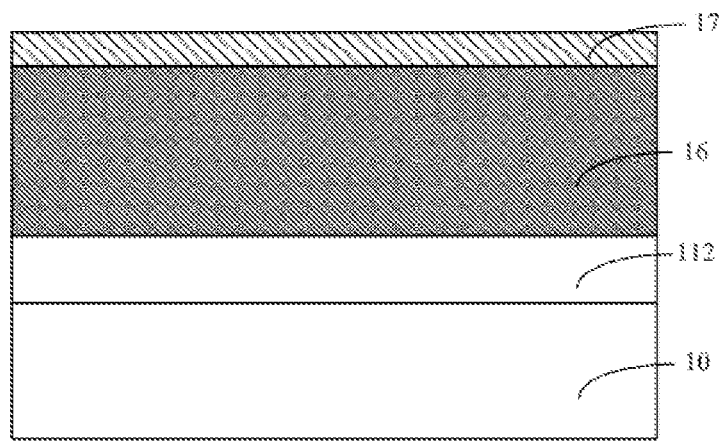
Figure 5:
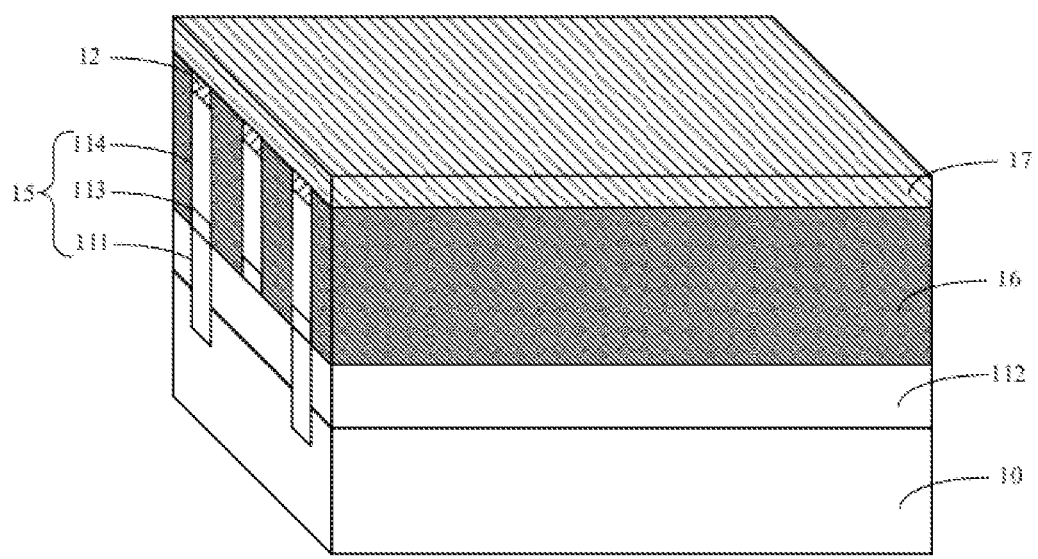
Figure 6:
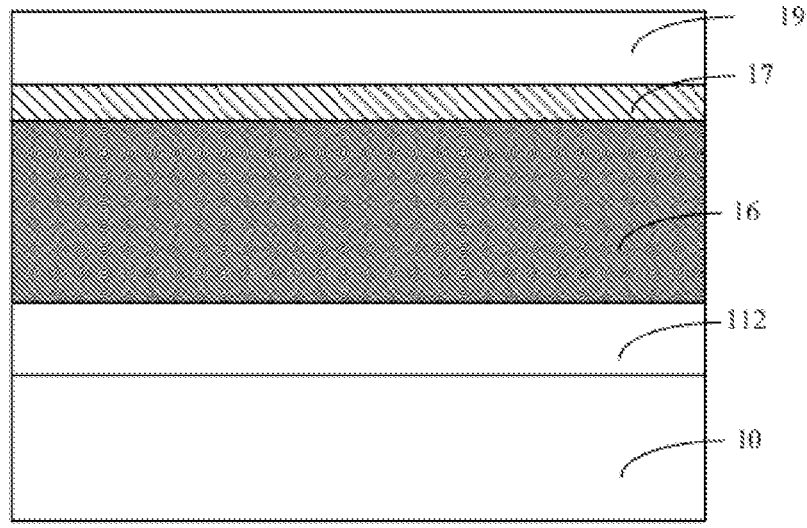
FIGS. 6 to 8 are schematic diagrams of formation of a capacitor contact hole according to an embodiment of the present application.
Figure 7:
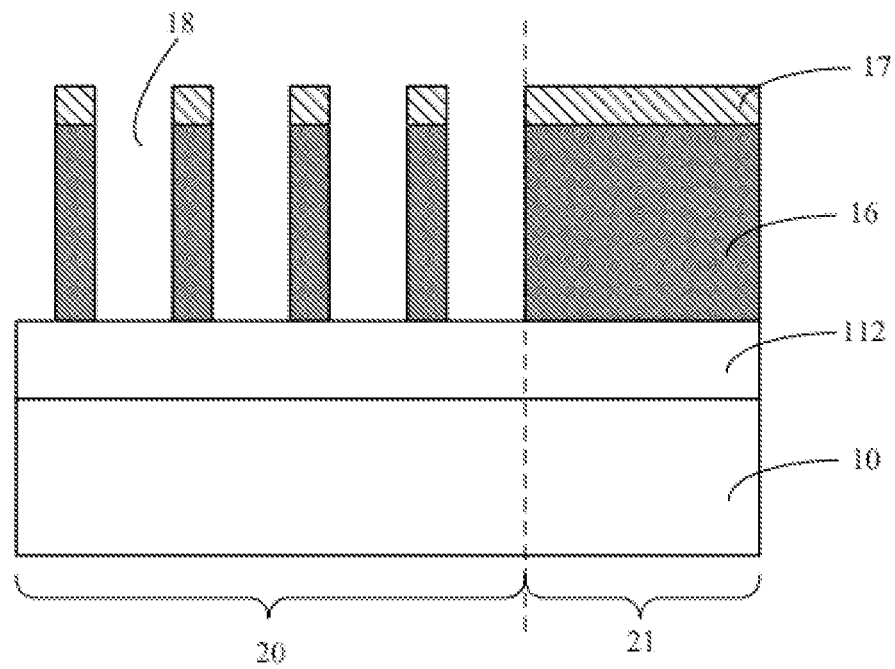
Figure 8:
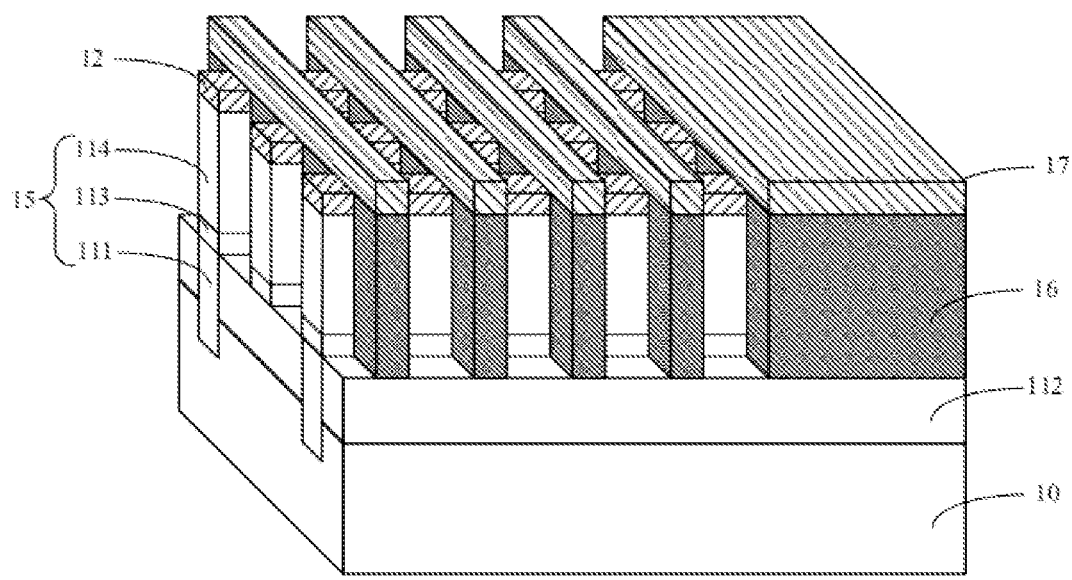
Figure 18:
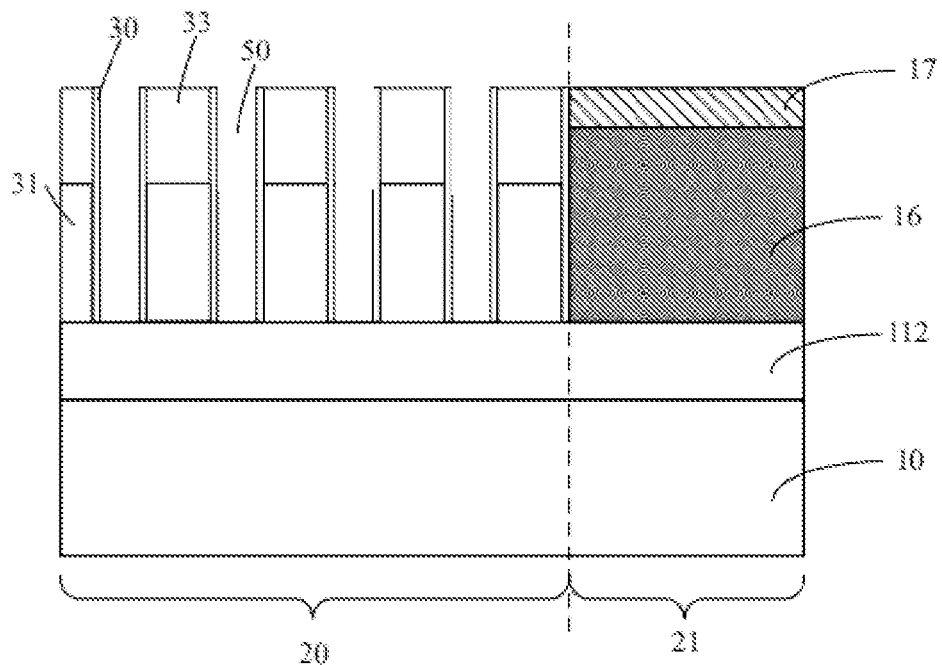
FIGS. 18 to 19 are schematic diagrams of formation of an air gap according to an embodiment of the present application.
Figure 19:
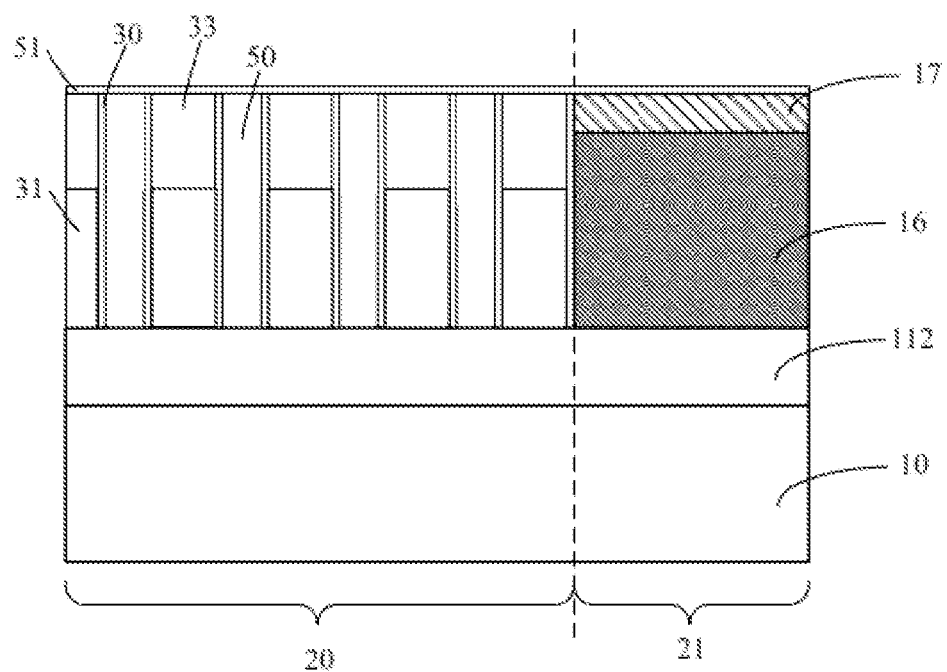

FIGS. 1 and 2 are schematic diagrams of formation of the bit line structure and the first protective layer in this embodiment; FIGS. 3 to 5 are schematic diagrams of formation of the dielectric layer and the second protective layer in this embodiment; FIGS. 6 to 8 are schematic diagrams of formation of the capacitor contact hole in this embodiment; FIGS. 9 to 14 are schematic diagrams of formation of the conductive layer in this embodiment; FIGS. 15 to 17B are schematic diagrams of formation of the capacitor contact structure in this embodiment; and FIGS. 18 to 19 are schematic diagrams of formation of the air gap in this embodiment. The method for forming the memory according to this embodiment will be specifically described in detail below with reference to the accompanying drawings.

Referring to FIGS. 1 and 2, which are schematic sectional diagrams perpendicular to an extension direction of the bit line structure. A substrate 10 is provided, and a bit line structure 15 and a first protective layer 12 on a top surface of the bit line structure 15 are formed on the substrate 10.

Specifically, referring to FIG. 1, the substrate 10 is provided. The substrate 10 includes an array area 20 (referring to FIG. 7) and a peripheral area 21 (referring to FIG. 7), and the substrate 10 includes structures such as a buried word line, a shallow trench isolating structure and an active area.

A bit line multi-layer 11 is formed on the substrate 10 and includes a bit line contact layer 111, a bottom dielectric layer 112, a metal layer 113 and a top dielectric layer that are stacked on the substrate 10.

A process flow of forming the bit line multi-layer 11 on the substrate 10 specifically includes: forming the bit line contact layer 111, which is connected to and independent from the active area in the substrate 10, on the substrate 10; forming a bottom dielectric layer 112 with which a gap between the bit line contact layers 111 is filled on the substrate 10, wherein a top surface of the bottom dielectric layer 112 is flush with a top surface of the bit line contact layer 111; forming the metal layer 113 on the top surfaces of the bottom dielectric layer 112 and the bit line contact layer 111; and forming the top dielectric layer 114 on a top surface of the metal layer 113.

The bit line contact layer 111 is made from tungsten or polycrystalline silicon, the bottom dielectric layer 112 and the top dielectric layer 114 are made from silicon nitride, silicon dioxide or silicon oxynitride, and the metal layer 113 is made from one or more conductive materials such as doped polycrystalline silicon, titanium, titanium nitride, tungsten, and tungsten composites.

A first protective film 115 is formed at a top of the bit line multi-layer 11 and configured to protect the bit line structure from being etched in a subsequent etching process.

In this embodiment, the first protective film 115 is made from silicon oxynitride. In other embodiments, the first protective film is made from an insulating material, such as silicon nitride or silicon oxide.

A patterned bit line mask layer 13 is formed on a top surface of the first protective film 115. It should be noted that the bit line mask layer 13 in FIG. 1 is illustrated by taking a single-layer structure as an example. It is apparent to those skilled in the art that in the actual etching process, the bit line mask layer 13 may also be of a multi-layer structure.

Referring to FIG. 2, the first protective film 115 and the bit line multi-layer 11 are etched by taking the bit line mask layer 13 as a mask to form the bit line structure 15 and the first protective layer 12 on the top surface of the bit line structure 15, and the bit line mask layer 13 is removed.

It should be noted that on a section of the same bit line structure, only one of the adjacent bit line structures 15 is connected to the active area in the substrate 10 by the bit line contact layer 111. As shown in FIG. 2, the bit line structure 15 on the left and the bit line structure 15 on the right are connected to the active area in the substrate 10 by the bit line contact layer 111. In other sectional drawings, only the bit line structure 15 in the middle may be connected to the active area in the substrate 10 by the bit line contact layer 111.

Referring to FIGS. 3 to 5, in which FIGS. 3 and 4 are schematic sectional diagrams parallel to the extension direction of the bit line structure, and FIG. 5 is a three-dimensional structural schematic diagram of a memory, a dielectric layer 16 with which a gap between the adjacent bit line structures 15 is filled is formed, a top surface of the dielectric layer 16 is flush with a top surface of the first protective layer 12, and a second protective layer 17 is formed on the top surfaces of the first protective layer 12 and the dielectric layer 16.

Specifically, referring to FIG. 3, a dielectric film (not shown) with which the gap between the adjacent bit line structures is filled and the bit line structure 15 is covered is formed and etched to form the dielectric layer 16. Specifically, the dielectric film (not shown) higher than the top surface of the bit line structure 15 is removed, and the dielectric film remained (not shown) forms the dielectric layer 16.

In this embodiment, the dielectric layer 16 is made from silicon oxide. In other embodiments, the dielectric layer 16 is made from other insulating materials, such as silicon nitride or silicon oxynitride.

In addition, in this embodiment, the dielectric film (not shown) is formed by a spin coating process, and the dielectric film (not shown) formed by the spin coating process has the advantage of excellent filling effect.

Referring to FIG. 4, a second protective layer 17 is formed on the top surfaces of the first protective layer 12 and the dielectric layer 16. In this embodiment, the second protective layer 17 and the first protective layer 12 are made from the same material. In other embodiments, the second protective layer and the first protective layer may be made from different materials.

A top-layer structure constituted by the first protective layer 12 and the second protective layer 17 effectively improves an arrangement mode at the top of a capacitor contact structure in the subsequent process of forming the capacitor contact structure, such that the capacitor contact structure is directly connected to a lower electrode plate of a capacitor that needs to be formed subsequently, which effectively improves the formation process of the memory.

It should be noted that the thickness of neither the first protective layer 12 nor the second protective layer 17 is limited in the embodiment of the present application, and the thicknesses of the first protective layer 12 and the second protective layer 17 may be set according to specific process requirements.

After deposition of the second protective layer 17 is completed, the spatial structure of the memory is as shown in FIG. 5.

Referring to FIGS. 6 to 8, in which FIGS. 6 and 7 are schematic sectional diagrams parallel to the extension direction of the bit line structure, and FIG. 8 is a three-dimensional structural schematic diagram of the memory, part of the dielectric layer 16 and part of the second protective layer 17 are removed in the direction perpendicular to the extension direction of the bit line structure 15 to form a capacitor contact hole 18, and the first protective layer 12 located between the adjacent capacitor contact holes 18 is exposed by the capacitor contact hole 18 in the direction perpendicular to the extension direction of the bit line structure 15.

Specifically, referring to FIG. 6, a dielectric mask layer 19 is formed on a top surface of the second protective layer 17.

It should be noted that the dielectric mask layer 19 in FIG. 6 is illustrated by taking one layer as an example. It is apparent to those skilled in the art that in the actual etching process, the dielectric mask layer 19 may be of a multi-layered structure.

Referring to FIG. 7, the second protective layer 17 is etched in the direction perpendicular to the extension direction of the bit line structure 15 by taking the dielectric mask layer 19 as a mask until part of the first protective layer 12 and part of the dielectric layer 16 are exposed, and the exposed part of the dielectric layer 16 is removed to form the capacitor contact hole 18.

Refer to FIG. 8 for the three-dimensional schematic diagram of the memory formed at this time.

Figure 9:
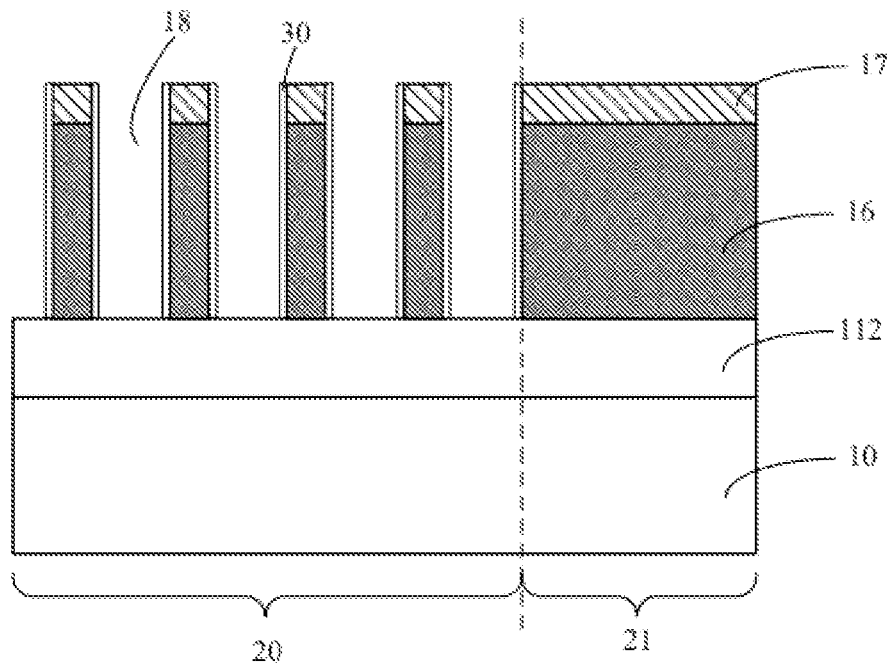
FIGS. 9 to 14 are schematic diagrams of formation of a conductive layer according to an embodiment of the present application.

Referring to FIG. 9, in this embodiment, after forming the capacitor contact hole 18 and before forming the conductive layer with which the capacitor contact hole 18 is filled, the method further includes: forming an isolating film (not shown) on the substrate 10, wherein the isolating film (not shown) is on the top surfaces of the second protective layer 17 and the first protective layer 12, as well as a side wall of the capacitor contact hole 18 and the surface of the substrate 10 at the bottom.

Specifically, the isolating film (not shown) is formed by means of atomic layer deposition which has the features of low deposition rate, and high compactness and excellent step coverage of the film formed by deposition, etc. In this way, the isolating film (not shown) with a relatively small thickness can perform effective isolation and protection, and is prevented from occupying a small space between the adjacent bit line structures 15.

The isolating film (not shown) on the top surface of the second protective layer 17, the top surface of the first protective layer 12, and the surface of the substrate 10 is removed to form an isolating layer 30 on the side wall of the capacitor contact hole 18.

In the process of removing the isolating film (not shown) on the surface of the substrate 10, part of the substrate 10 needs to be etched until a surface of the active area in the substrate 10 is exposed, such that the bottom of the subsequently formed conductive layer is connected to the active area.

It should be noted that the isolating layer 30 is only shown in the schematic sectional diagram parallel to the extension direction of the bit line structure in the subsequent drawings. In the specific three-dimensional structural diagram, in order to ensure that those skilled in the art can visually see a difference of the top morphology, a structural representation of the isolating layer 30 is not provided. It should be known by those skilled in the art that the isolating layer 30 should be included in the three-dimensional structural schematic diagram of the present application.

Figure 10:
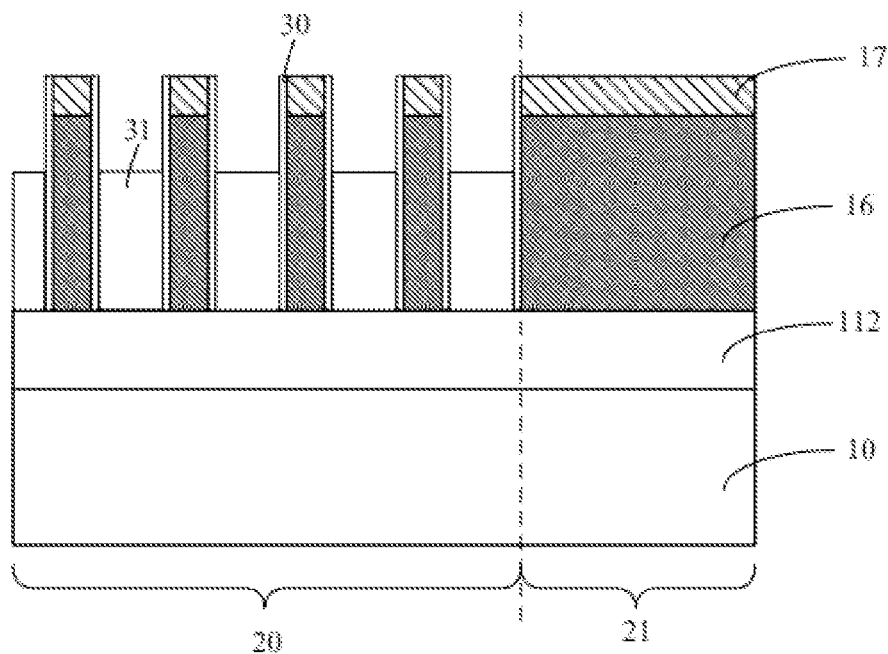
Figure 11:
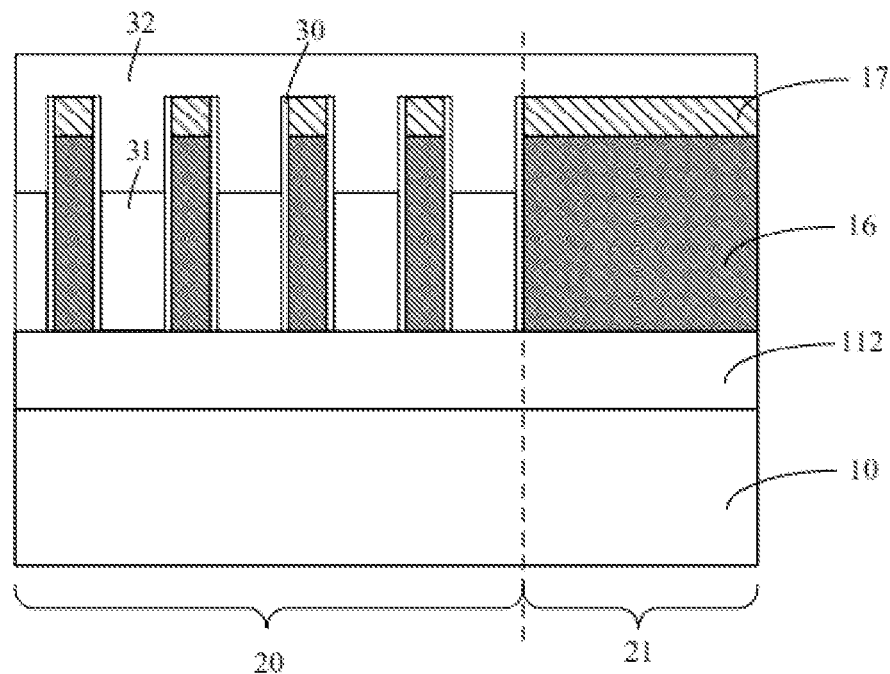
Figure 12:
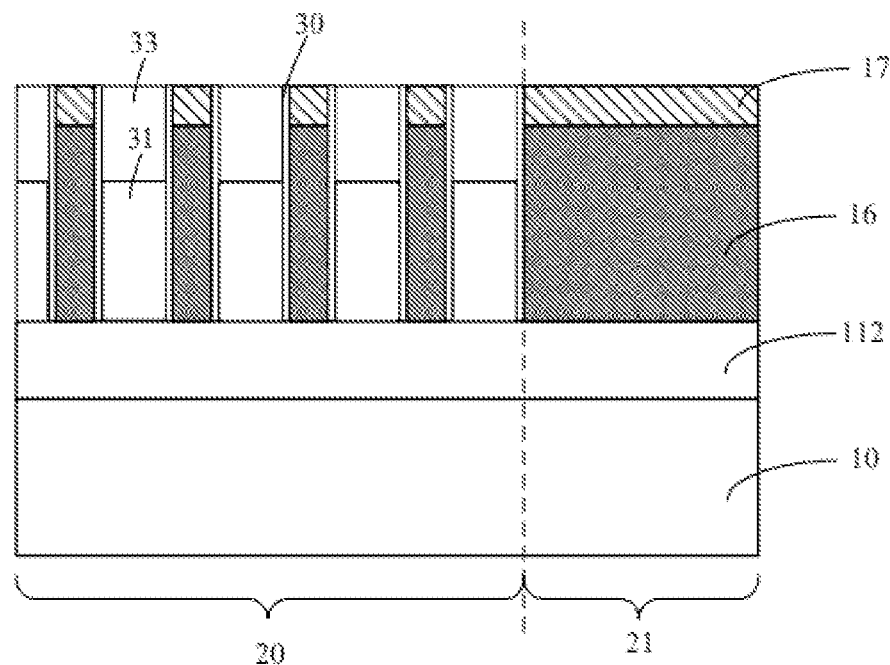
Figure 13:
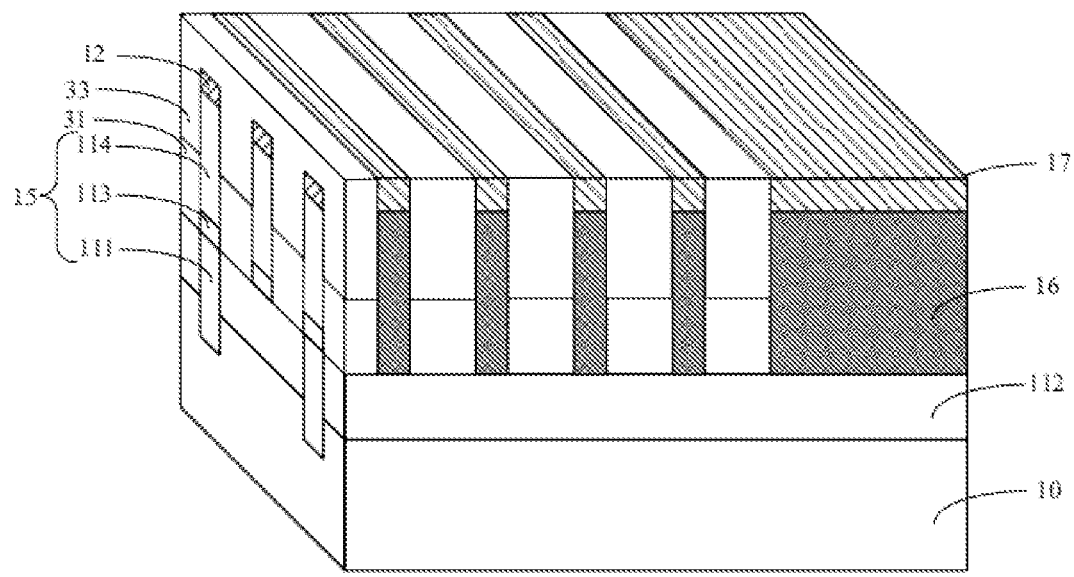
Figure 14:
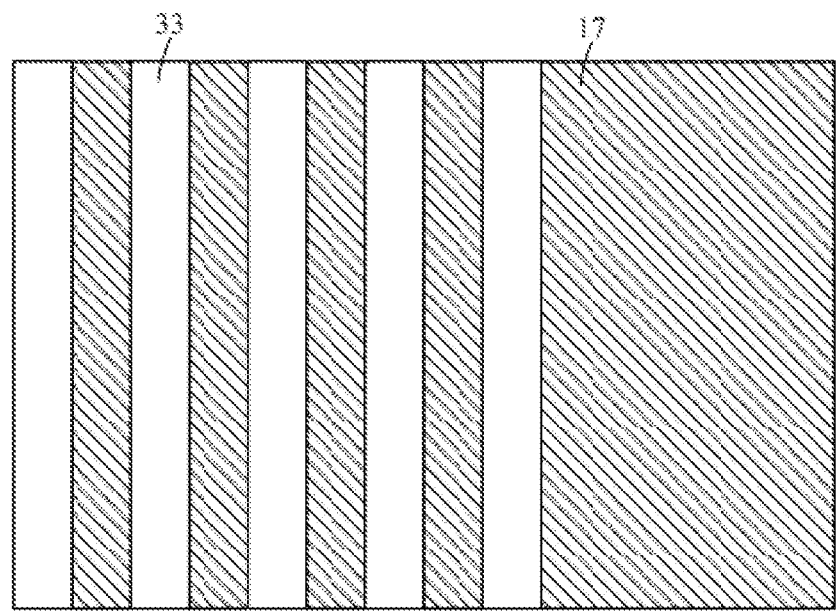

Referring to FIGS. 10 to 14, in which FIGS. 10 to 12 are schematic sectional diagrams parallel to the extension direction of the bit line structure, FIG. 13 is a three-dimensional structural schematic diagram of the memory, and FIG. 14 is a schematic top view of the memory, the capacitor contact hole 18 is filled to form the conductive layer, the top surface of the conductive layer is flush with the top surface of the second protective layer 17, the conductive layer also covers the top surface of the first protective layer 12 exposed by the remaining second protective layer 17 in the direction perpendicular to the bit line structure 15, and the conductive layer is configured to subsequently form the capacitor contact structure.

In this embodiment, the conductive layer includes a first conductive layer 31 and a second conductive layer 33 which are made from different materials. A top surface of the second conductive layer 33 is flush with a top surface of the second protective layer 17. The second conductive layer 33 covers the top surface of the first protective layer 12 in the direction perpendicular to the extension direction of the bit line structure 15.

The first conductive layer 31 is made from a semiconductor conductive material, e.g., polycrystalline silicon, and a top conductive material is a metal conductive material, e.g., a metal material with low resistivity such as tungsten and silver. It should be noted that a conductive layer of a two-layer structure is taken as an example for illustration, which does not constitute a limitation to this embodiment. In other embodiments, the conductive layer may only be of a single-layer structure. Steps of forming the conductive layer are described below with reference to the drawings.

Referring to FIG. 10, the first conductive layer 31 is formed in the capacitor contact hole 18, and the top surface of the first conductive layer 31 is lower than the top surface of the first protective layer 12.

Referring to FIG. 11, a top conductive film 32 is formed on the top surface of the first conductive layer 31, the top surface of the first protective layer 12, and the top surface of the second protective layer 17.

Specifically, in this embodiment, the top conductive film 32 is formed by a spin coating process, and the top conductive film (not shown) formed by the spin coating process has the advantage of excellent filling effect.

Referring to FIG. 12, the top conductive film 32 is etched to form the second conductive layer 33.

In this embodiment, the top conductive film 32 is etched to form the second conductive layer 33 by means of chemical and mechanical grinding; and the top surface of the top conductive film 32 is planarized by means of chemical and mechanical grinding. The chemical mechanical grinding has a higher removal rate than the etching process and is beneficial to shorten the process cycle.

At this time, refer to FIG. 13 for the three-dimensional structural schematic diagram of the formed memory, and refer to FIG. 14 for the top view of the top morphology.

Referring to FIG. 8, the capacitor contact holes are arranged in a square for subsequent filling to form the capacitor contact structure. The capacitor contact holes and the dielectric layer 16 are alternately arranged parallel to the extension direction of the bit line structure 15; and the capacitor contact holes and the bit line structure 15 are alternately arranged perpendicular to the extension direction of the bit line structure 15, and at this time, seen from the top of the memory, the capacitor contact holes are arranged in a square. The capacitor contact holes are arranged differently from the lower electrode of the capacitor. It is usually necessary to additionally form a layer of dislocation contact pad to connect the lower electrode plate of the capacitor to the capacitor contact structure, resulting in a complicated process and a slow progress.

In the embodiment of the present application, owing to the structure that a height difference exists between the first protective layer 12 and the second protective layer 17, the capacitor contact structure formed by etching changes the arrangement mode at the top of the capacitor contact structure. Referring to FIGS. 8 and 13, due to the height difference between the first protective layer 12 and the second protective layer 17, the capacitor contact hole and the top surface of the first protective layer 12 are filled with the formed conductive layer, and the adjacent conductive layers with which the capacitor contact hole is filled are connected by the top surface of the first protective layer 12 perpendicular to the extension direction of the bit line structure 15. Refer to FIG. 17A for the top morphology of the capacitor contact structure formed by etching, and the etching is performed by taking the contact mask layer 40 formed in a preset direction with reference to FIG. 16 as a mask. The top surface of the etched conductive layer (i.e., a second part 33b of the second conductive layer 33) is flush with the top surface of the first protective layer 12, and the top surface of the unetched conductive layer (i.e., a third part 33c of the second conductive layer 33) is flush with the second protective layer 17.

Compared with the related art, the top of the capacitor contact structure alternated with the bit line structure 15 perpendicular to the extension direction of the bit line structure 15 is partially on the top surface of the first protective layer 12, and the preset direction and the extension direction of the bit line structure 15 form a certain angle, thus changing the arrangement mode at the top of the capacitor contact structure, and making the arrangement mode more approximate to the minimum hexagonal arrangement mode of the capacitor that needs to be formed later. Therefore, the space utilization rate is optimized, and the capacitor formed later is larger in size. Moreover, the process step of manufacturing the dislocation contact pad is omitted, and thus, the method for forming the memory is greatly optimized.

Figure 15:
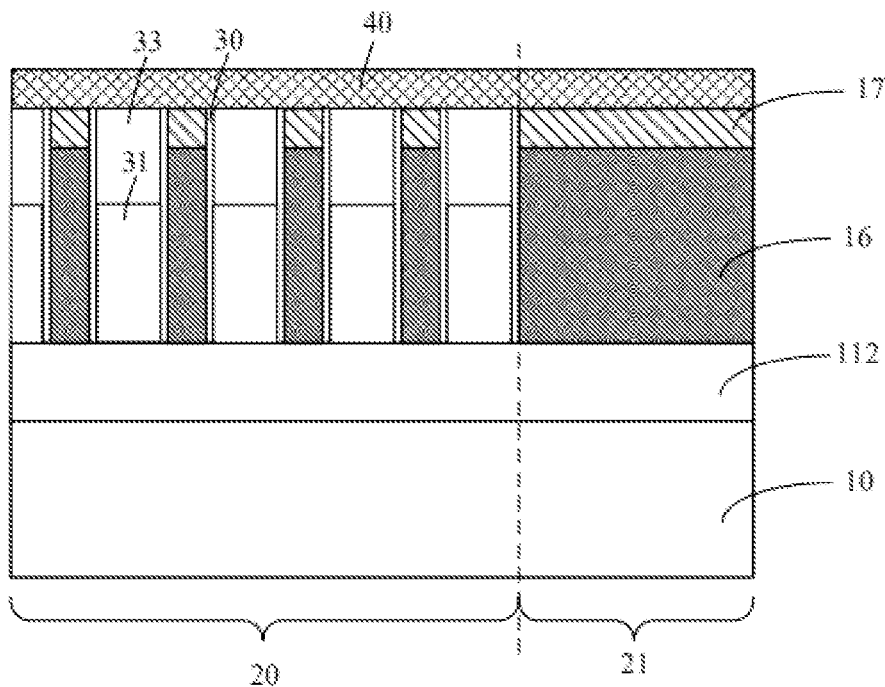
Figure 16:
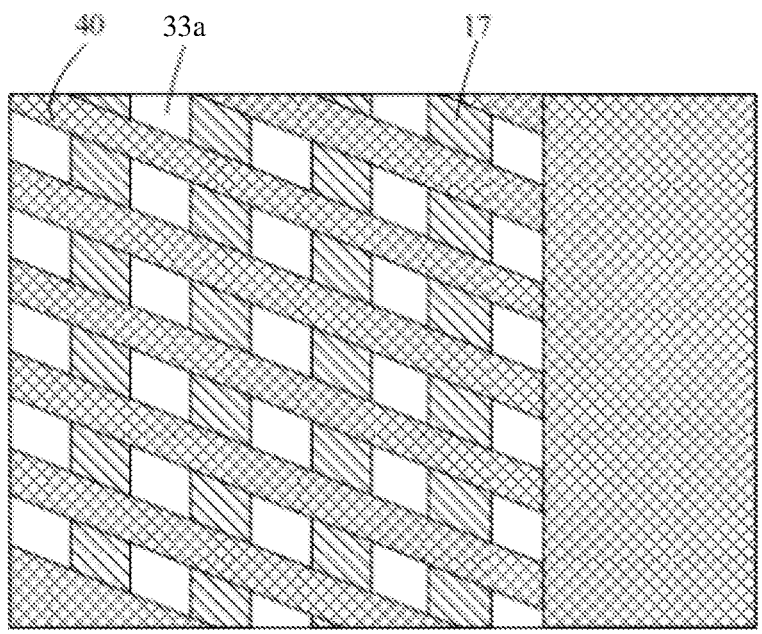
Figure 17A:
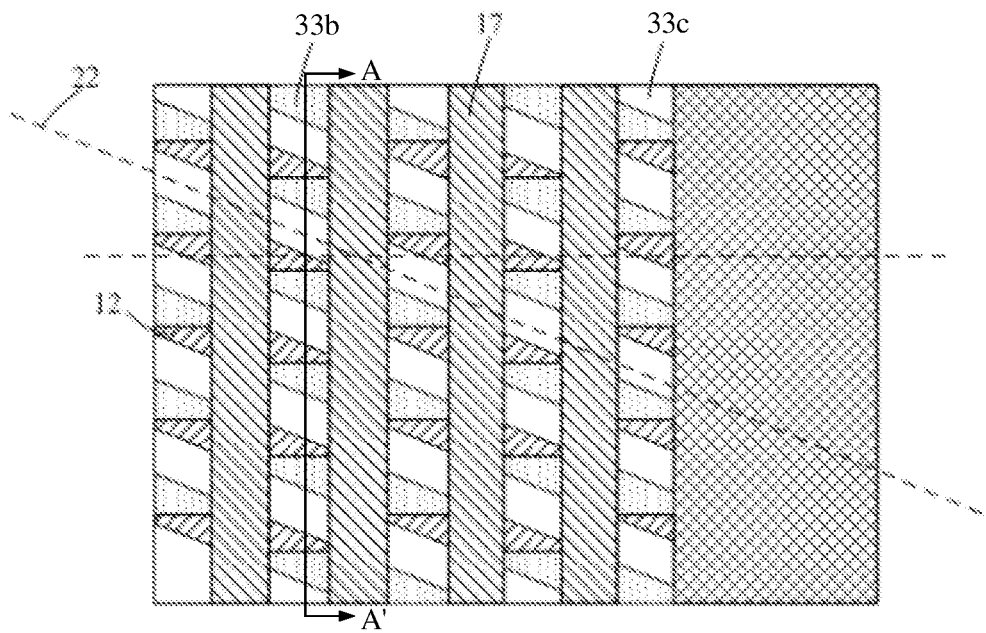

Referring to FIGS. 15 to 17A, in which FIG. 15 is a schematic sectional diagram parallel to the extension direction of the bit line structure, and FIGS. 16 and 17A are schematic top views of the memory, a first part 33a of the second conductive layer 33 is etched to form the separate capacitor contact structure.

Referring to FIGS. 15 and 16, a contact mask layer 40 is formed on the top surfaces of the second conductive layer 33 and the second protective layer 17; the contact mask layer 40 exposes the first part 33a of the second conductive layer 33 and the second protective layer 17 of preset widths in a preset direction, and the contact mask layer 40 and the first part 33a of the second conductive layer 33 and second protective layer 17 that are exposed are alternately arranged perpendicular to the preset direction; the preset direction (referring to the dotted line 22 in FIG. 17A) and the extension direction of the bit line structure 15 form an angle α that is greater than 0° and unequal to 90°; in the preset direction, the first part 33a of the second conductive layer 33 is etched until part of the first protective layer 12 is exposed; and the contact mask layer 40 is removed, and the rest of the conductive layer serves as the capacitor contact structure.

Specifically, the preset direction and the extension direction of the bit line structure form a certain angle α (α is greater than 0° and unequal to 90°), the first part 33a of the second conductive layer 33 that is exposed by the contact mask layer 40 is etched until the first protective layer 12 is exposed, and the contact mask layer 40 is removed. At this time, the height of the second part 33b of the second conductive layer 33 (the dot-filled portion in the figure) is consistent with the height of the first protective layer 12, and the height of the third part 33c of the second conductive layer 33 is consistent with the height of the second protective layer 17.

At this time, as seen from the top view, in a position where the first protective layer 12 is exposed, the second part 33b of the second conductive layer 33 is not electrically connected to the third part 33c of the second conductive layer 33; and in a position where the first protective layer 12 is not exposed, the second part 33b of the second conductive layer 33 is electrically connected to the third part 33c of the second conductive layer 33. That is, the conductive layers are separated at the position where the first protective layer 12 is exposed, to form the separate capacitor contact structure (the second part 33b of the second conductive layer 33 and the third part 33c of the second conductive layer 33 that are not separated by the first protective layer 12). The square arrangement mode at the top of the capacitor contact structure, which is originally kept consistent with the capacitor contact hole, is changed, and the capacitor contact structure is directly connected to the lower electrode plate of the subsequently formed capacitor, eliminating the process step of making the dislocation contact pad, and greatly optimizing the method for forming the memory.

In addition, referring to FIGS. 18 and 19, in this embodiment, after forming the separate capacitor contact structure, the method further includes: removing the dielectric layer 16 to form an air gap 50. By locating and removing the dielectric layer 16 between the capacitor contact structures on the first protective layer 12 and the second protective layer 17, the air gap is formed to reduce a dielectric constant between the capacitor contact structures, so that stray capacitance between the capacitor contact structures is reduced, and the air gap is of great importance to reduce the integration level of the memory.

Specifically, referring to FIG. 18, an isolating mask layer (not shown) on the top surface of the second protective layer 17 is formed, and based on the isolating mask layer (not shown), the second protective layer 17 at the top of the capacitor structure is patterned and removed parallel to the bit line structure 15 to expose the dielectric layer 16 between two adjacent ones of the capacitor contact structures. The dielectric layer 16 between the capacitor contact structures is removed to form the air gap 50.

Referring to FIG. 19, a sealing layer 51 is formed, and the sealing layer 51 seals the top of the air gap 50.

The sealing layer 51 is formed by a quick sealing process. The sealing layer 51 seals the air gap 50 to form an air gap isolating structure, which greatly improves the stray capacitance between the capacitor contact structures, and makes the structural performance of the formed memory more excellent.

Specifically, since the sealing layer 51 is formed by the quick sealing process, quick deposition can be realized, and the formed sealing layer 51 is configured to seal the top of the air gap 50 to form an air isolating structure. In this embodiment, the sealing layer 51 is made from silicon nitride. In other embodiments, the sealing layer is made from an insulating semiconductor material, such as silicon oxynitride or silicon oxide.

Compared with the related art, the present application has the advantages that the first protective layer is formed at the top of the bit line multi-layer when the bit line multi-layer is formed, and in the following manufacturing process, the second protective layer is formed at the top of the first protective layer; and the high and low staggered protective layers are ingeniously formed at the top of the bit line structure, which not only helps to reduce loss of the bit line structure in an etching process, but also ingeniously forms a connecting layer between a capacitor and the capacitor contact structure by one-step etching using a top-layer structure formed by the high and low staggered protective layers. Therefore, the existing manufacturing process flow of the memory is simplified, further, the production efficiency of the memory is improved, and the production and operation costs of the memory are reduced.

The various steps above are divided only for the clarity of description. When implemented, these steps can be combined into one step, or some of them are split into multiple steps, which all fall within the scope of protection of this patent as long as they include the same logical relationship. Adding insignificant modifications or introducing insignificant designs into the process without changing the core design of the process shall all fall within the scope of protection of this patent.

Another embodiment of the present application relates to a memory, which may be formed by the above-mentioned method.

Referring to FIGS. 2, 12 and 17A, the memory provided in this embodiment will be described in detail below with reference to the accompanying drawings. The portions that are the same as or corresponding to the above embodiment will not be repeated below.

The memory includes: a substrate 10 and a bit line structure 15 on the substrate 10; a first protective layer 12 on a top surface of the bit line structure 15; a capacitor contact structure and an isolating structure that are located between the bit line structures 15, wherein the capacitor contact structure and the isolating structure are alternately arranged in an extension direction of the bit line structure 15; a second protective layer 17 on top surfaces of the first protective layer 12 and the isolating structure that are located between the adjacent bit line structures 15, wherein an extension direction of the second protective layer 17 is perpendicular to the extension direction of the bit line structure 15; bulges disposed at a top of the capacitor contact structure, extending at intervals in a preset direction and on the top surface of part of the first protective layer 12, wherein the preset direction and the extension direction of the bit line structure 15 form an angle α that is greater than 0° and unequal to 90°.

Specifically, the substrate 10 includes an array area and a peripheral area, and the substrate 10 includes structures such as a buried word line, a shallow trench isolating structure, and an active area.

Referring to FIG. 2, the bit line structure 15 includes a bit line contact layer 111 or a bottom matrix layer 112, a metal layer 113, and a top dielectric layer 114 which are sequentially stacked on the substrate 10. The bit line contact layer 111 is made from tungsten or polycrystalline silicon, the bottom dielectric layer 112 and the top dielectric layer 114 are made from silicon nitride, silicon dioxide, or silicon oxynitride, and the metal layer 113 is made from one or more conductive materials, such as doped polycrystalline silicon, titanium, titanium nitride, tungsten, and tungsten composites.

The first protective layer 12 is configured to protect the bit line structure from being etched in a subsequent etching process. In this embodiment, the first protective layer 12 is made from silicon oxynitride. In other embodiments, the first protective layer is made from an insulating material, such as silicon nitride or silicon oxide.

It should be noted that on a section of the same bit line structure, only one of the adjacent bit line structures 15 is connected to the active area in the substrate 10 by the bit line contact layer 111.

Correspondingly, the isolating structure includes a dielectric layer or an air gap. Referring to FIG. 12, in this embodiment, the isolating structure between the capacitor contact structures is a dielectric layer 16 made from silicon oxide. In other embodiments, the dielectric layer 16 is made from an insulating material, such as silicon nitride or silicon oxynitride.

An extension direction of the second protective layer 17 is perpendicular to the extension direction of the bit line structure 15, and the second protective layer 17 is on top surfaces of the first protective layer 12 and the isolating structure that are located between the adjacent bit line structures. In this embodiment, the second protective layer 17 and the first protective layer 12 are made from the same material. In other embodiments, the second protective layer is made from an insulating material, such as silicon nitride or silicon oxide.

In a specific example, the second protective layer 17 is located perpendicular to the extension direction of the bit line structure 15.

A top-layer structure constituted by the first protective layer 12 and the second protective layer 17 effectively improves an arrangement mode at the top of a capacitor contact structure in the subsequent process of forming the capacitor contact structure, such that the capacitor contact structure is directly connected to a lower electrode plate of a capacitor that needs to be formed subsequently, which effectively improves the formation process of the memory.

It should be noted that neither the thickness of the first protective layer 12 nor the thickness of the second protective layer 17 is limited in the embodiment of the present application, and the thicknesses of the first protective layer 12 and the second protective layer 17 may be set according to specific process requirements.

The capacitor contact structure and the isolating structure located between the bit line structures 15 are arranged alternately in the extension direction of the bit line structure. In a preset direction, the capacitor contact structure has bulges on the top surface of part of the first protective layer. The preset direction and the extension direction of the bit line structure 15 form an angle. The bottom of the capacitor contact structure is connected to the active area in the substrate 10. In an example, the angle is α, and α is greater than 0° and unequal to 90°.

Figure 17B:
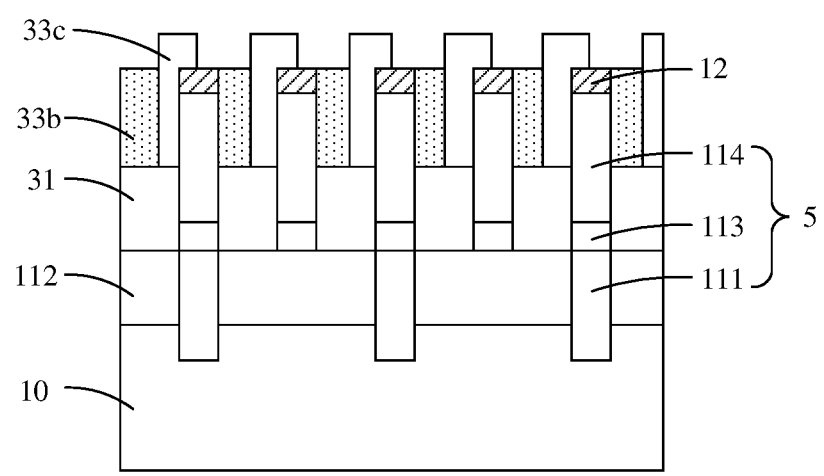
FIG. 17B is a schematic cross-sectional diagram of formation of a capacitor contact structure along lines A-A'.

Referring to FIG. 17A, as seen from the top view, in a position where the first protective layer 12 is exposed, the second part 33b of the second conductive layer 33 is not electrically connected to the third part 33c of the second conductive layer 33 (i.e., the bulges at the top of the capacitor contact structure, which is also illustrated in FIG. 17B); and in a position where the first protective layer 12 is not exposed, the second part 33b of the second conductive layer 33 is electrically connected to the third part 33c of the second conductive layer 33 (i.e., the bulges at the top of the capacitor contact structure, which is also illustrated in FIG. 17B). That is, the conductive layers are separated at the position where the first protective layer 12 is exposed, to form the separate capacitor contact structure (the second part 33b of the second conductive layer 33 and the third part 33c of the second conductive layer 33 that are not separated by the first protective layer 12). The original square arrangement mode of the capacitor contact structure is changed, and the capacitor contact structure is directly connected to the lower electrode plate of the subsequently formed capacitor, eliminating the process step of making the dislocation contact pad, and greatly optimizing the method for forming the memory.

In addition, in other embodiments, the memory further includes an isolating layer on a side wall of the isolating structure.

In addition, in other embodiments, the isolating structure between the capacitor contact structures is an air gap.

Compared with the related art, the present application has the advantages that since the top of the capacitor contact structure formed in the present application is partially on the top surface of the first protective layer, the original arrangement mode of the capacitor contact structure is changed, such that a connection between the capacitor and the capacitor contact structure that are formed subsequently becomes simple. Therefore, the existing manufacturing process flow of the memory is improved, the production efficiency of the memory is improved and the production and operation costs of the memory are reduced.

Since the above-mentioned embodiments correspond to this embodiment, this embodiment can be implemented in cooperation with the above-mentioned embodiments. The relevant technical details mentioned in the above embodiments are still valid in this embodiment, and the technical effects that can be achieved in the above embodiments can also be achieved in this embodiment, which thus will not be repeated herein for reducing repetition. Correspondingly, the relevant technical details mentioned in this embodiment can also be applied to the above-mentioned embodiments.

Those of ordinary skill in the art may understand that the above embodiments are specific embodiments for implementing the present application, and in practice, various formal or detail changes may be made without departing from the spirit and scope of the present application.

What is claimed is:

1. A method for forming a memory, comprising:
   providing a substrate, and forming a bit line structure on the substrate and a first protective layer on a top surface of the bit line structure;
   forming a dielectric layer with which a gap between two adjacent ones of the bit line structures is filled, wherein a top surface of the dielectric layer is flush with a top surface of the first protective layer;
   forming a second protective layer to cover the top surface of the first protective layer and the top surface of the dielectric layer;
   removing part of the dielectric layer and part of the second protective layer in a direction perpendicular to an extension direction of the bit line structure to form a capacitor contact hole, and exposing the first protective layer between two adjacent ones of the capacitor contact holes in the direction which is perpendicular to the extension direction of the bit line structure, wherein an unremoved part of the dielectric layer forms an isolating structure, and a material of the second protective layer is different from a material of the isolating structure;
   forming a conductive layer to fill the capacitor contact holes and cover the top surface of the first protective layer exposed, wherein a top surface of the conductive layer is flush with a top surface of the second protective layer; and
   etching part of the conductive layer to form a separate capacitor contact structure wherein an unetched part of the conductive layer forms bugles extending at intervals in a preset direction and on the top surface of part of the first protective layer, and the preset direction and the extension direction of the bit line structure form an angle.

2. The method for forming the memory according to claim 1, wherein etching the part of the conductive layer to form the separate capacitor contact structure comprises:
   forming a contact mask layer on the top surfaces of both the conductive layer and the second protective layer;
   exposing, by the contact mask layer, both the conductive layer and the second protective layer of a preset width in the preset direction, wherein the contact mask layer and the conductive layer and the second protective layer exposed are alternately arranged perpendicular to the preset direction, and the angle is greater than 0° and not equal to 90°;

etching the conductive layer exposed until part of the top surface of the first protective layer is exposed; and removing the contact mask layer, wherein the rest of the conductive layer serves as the capacitor contact structure.

3. The method for forming the memory according to claim 1, wherein forming the bit line structure on the substrate and the first protective layer on the top surface of the bit line structure comprises:

forming a bit line multi-layer on the substrate and a first protective film at a top of the bit line multi-layer;

forming a patterned bit line mask layer on a top surface of the first protective film, and etching the first protective film and the bit line multi-layer by taking the patterned bit line mask layer as a mask to form the bit line structure and the first protective layer on the top surface of the bit line structure; and removing the patterned bit line mask layer.

4. The method for forming the memory according to claim 3, wherein forming the bit line multi-layer on the substrate comprises:

forming a separate bit line contact layer on the substrate, wherein the bit line contact layer is connected to an active area in the substrate;

forming a bottom dielectric layer on the substrate to fill a gap between two adjacent ones of the bit line contact layers, wherein a top surface of the bottom dielectric layer is flush with a top surface of the bit line contact layer;

forming a metal layer on the top surfaces of both the bottom dielectric layer and the bit line contact layer; and forming a top dielectric layer on a top surface of the metal layer.

5. The method for forming the memory according to claim 1, wherein removing the part of the dielectric layer and the part of the second protective layer in the direction perpendicular to the extension direction of the bit line structure to form the capacitor contact hole comprises:

forming a dielectric mask layer on the top surface of the second protective layer;

etching the part of the second protective layer in the direction perpendicular to the extension direction of the bit line structure by taking the dielectric mask layer as a mask until the top surfaces of the part of the first protective layer and the part of the dielectric layer are exposed; and removing the exposed part of the dielectric layer to form the capacitor contact hole.

6. The method for forming the memory according to claim 1, wherein after forming the capacitor contact hole and before forming the conductive layer with which the capacitor contact hole is filled, the method further comprises:

forming an isolating film on the substrate, wherein the isolating film covers the second protective layer and the exposed first protective layer and both a side wall and a bottom of the capacitor contact hole; and removing the isolating film on the top surface of the second protective layer, on the top surface of the exposed first protective layer and at the bottom of the capacitor contact hole, to form an isolating layer on the side wall of the capacitor contact hole.

7. The method for forming the memory according to claim 1, wherein the conductive layer comprises a first conductive layer and a second conductive layer that are made from different materials; a top surface of the second conductive layer is flush with the top surface of the second protective layer; and the second conductive layer further covers the top surface of the first protective layer in the direction perpendicular to the extension direction of the bit line structure.

8. The method for forming the memory according to claim 7, wherein forming the conductive layer with which the capacitor contact hole is filled comprises:

forming the first conductive layer in the capacitor contact hole, wherein a top surface of the first conductive layer is lower than the top surface of the first protective layer;

forming a top conductive film on the top surface of the first conductive layer, the top surface of the first protective layer and the top surface of the second protective layer; and etching the top conductive film to form the second conductive layer.

9. The method for forming the memory according to claim 1, wherein after forming the separate capacitor contact structure, the method comprises:

forming an isolating mask layer on the top surface of the second protective layer;

patterning the second protective layer at a top of the capacitor contact structure in the extension direction of the bit line structure by taking the isolating mask layer as a mask to expose the dielectric layer between two adjacent ones of the capacitor contact structures;

removing the dielectric layer between the two adjacent ones of the capacitor contact structures to form an air gap; and forming a sealing layer to seal a top of the air gap.

10. The method for forming the memory according to claim 1, wherein forming the dielectric layer to fill the gap between the two adjacent ones of the bit line structures comprises:

forming a dielectric film to fill the gap between the two adjacent ones of the bit line structures, wherein the dielectric film covers the bit line structure; and removing the dielectric film that is higher than the top surface of the bit line structure, wherein the dielectric film that remains forms the dielectric layer.

11. A memory, comprising:

a substrate and a bit line structure on the substrate;

a first protective layer on a top surface of the bit line structure;

a capacitor contact structure and an isolating structure that are located between two adjacent ones of the bit line structures, wherein the capacitor contact structure and the isolating structure are alternately arranged in an extension direction of the bit line structure;

a second protective layer, wherein a first part of the second protective layer is located on a top surface of the isolating structure that is located between two adjacent ones of the bit line structures, a second part of the second protective layer is located on a top surface of the first protective layer on part of the bit line structure, and the part of the bit line structure is located between two adjacent ones of the isolating structures, wherein an extension direction of the second protective layer is different from the extension direction of the bit line structure, wherein a material of the second protective layer is different from a material of the isolating structure; and bulges disposed at a top of the capacitor contact structure and extending at intervals in a preset direction and on the top surface of part of the first protective layer, wherein the preset direction and the extension direction of the bit line structure form an angle.

12. The memory according to claim 11, wherein the angle is greater than 0° and not equal to 90°.

13. The memory according to claim 11, wherein the extension direction of the second protective layer is perpendicular to the extension direction of the bit line structure.

14. The memory according to claim 11, further comprising an isolating layer on a side wall of the capacitor contact structure.

15. The memory according to claim 11, wherein the isolating structure comprises a dielectric layer or an air gap.

* * * * *